(12) United States Patent
Tan

(10) Patent No.: US 10,707,147 B2
(45) Date of Patent: *Jul. 7, 2020

(54) CLIP FOR SEMICONDUCTOR PACKAGE

(71) Applicant: SEMICONDUCTOR COMPONENTS INDUSTRIES, LLC, Phoenix, AZ (US)

(72) Inventor: Ariel Sotomayor Tan, Cavite (PH)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,518

(22) Filed: Dec. 27, 2018

(65) Prior Publication Data

US 2019/0148263 A1 May 16, 2019

Related U.S. Application Data

(63) Continuation of application No. 15/814,670, filed on Nov. 16, 2017, now Pat. No. 10,204,844.

(51) Int. Cl.
*H01L 23/495* (2006.01)
*H01L 23/40* (2006.01)
*H01L 23/00* (2006.01)

(52) U.S. Cl.
CPC ........ *H01L 23/4093* (2013.01); *H01L 23/495* (2013.01); *H01L 23/49524* (2013.01); *H01L 24/40* (2013.01); *H01L 24/84* (2013.01); *H01L 2224/32245* (2013.01); *H01L 2224/40245* (2013.01); *H01L 2224/73263* (2013.01); *H01L 2224/80121* (2013.01); *H01L 2224/83385* (2013.01); *H01L 2224/83815* (2013.01); *H01L 2224/84138* (2013.01)

(58) Field of Classification Search
CPC .......................... H01L 23/4093; H01L 23/495
See application file for complete search history.

(56) References Cited

U.S. PATENT DOCUMENTS

| | | | |
|---|---|---|---|
| 4,935,803 A | 6/1990 | Kalfus et al. | |
| 7,095,113 B2 | 8/2006 | Xiachun et al. | |
| 7,902,657 B2 | 3/2011 | Gomez | |
| 2005/0275089 A1 | 12/2005 | Joshi et al. | |
| 2009/0121331 A1 | 5/2009 | Cruz | |
| 2014/0367739 A1 | 12/2014 | Muto et al. | |

*Primary Examiner* — Douglas M Menz
(74) *Attorney, Agent, or Firm* — Adam R. Stephenson, Ltd.

(57) ABSTRACT

Implementations of a clip may include a die attach portion including at least one protrusion extending from the die attach portion and a lead frame alignment portion including at least one alignment feature. The at least one alignment feature may be configured to couple into at least one hole in a lead frame thereby aligning the clip with the lead frame. The at least one protrusion may be configured to couple into at least one recess in the die.

20 Claims, 3 Drawing Sheets

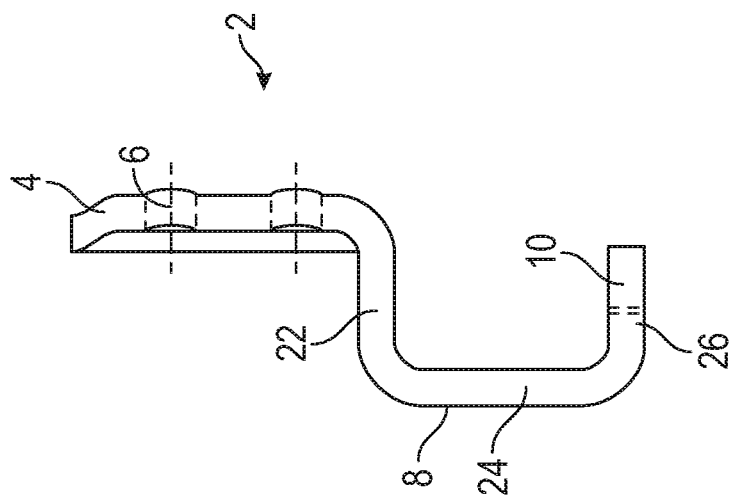
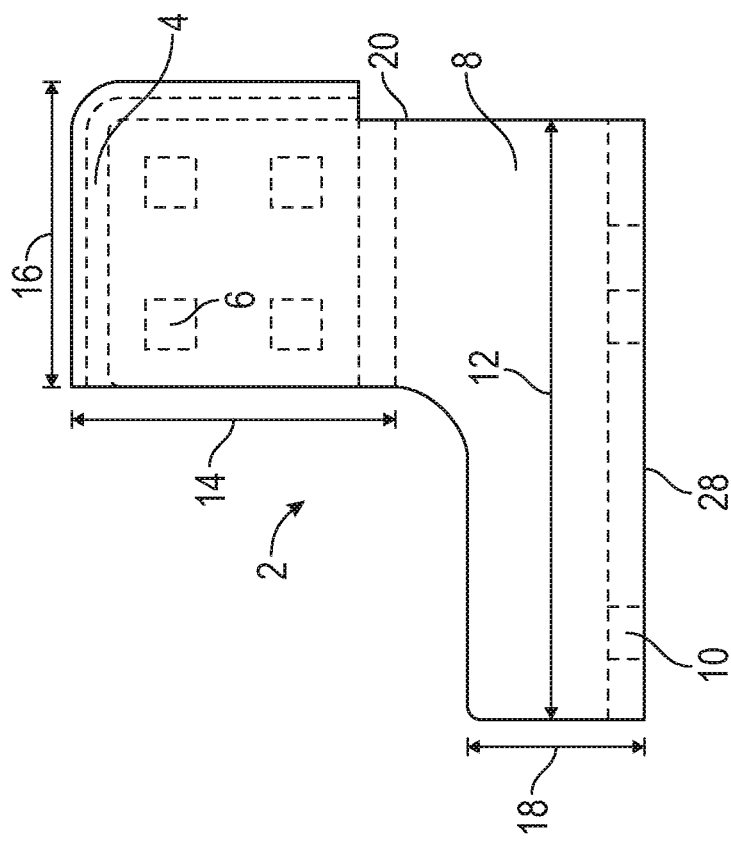
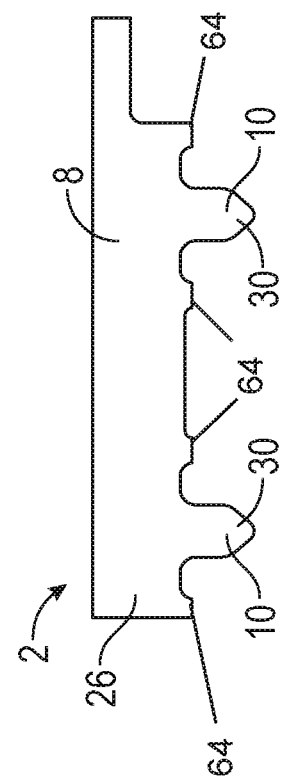
FIG. 1
FIG. 2
FIG. 3

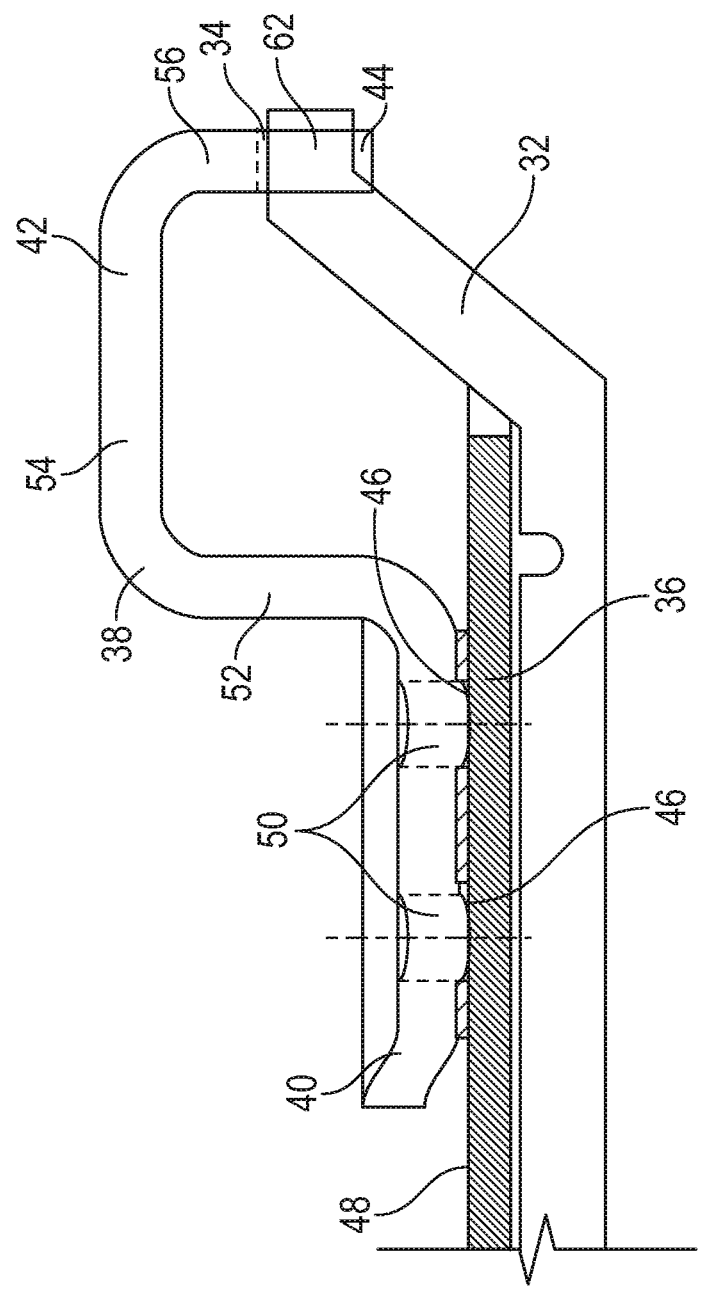

CLIP FOR SEMICONDUCTOR PACKAGE

CROSS REFERENCE TO RELATED APPLICATIONS

This application is a continuation application of the earlier U.S. Utility patent application to Ariel Sotomayor Tan entitled "Clip For Semiconductor Package," application Ser. No. 15/814,670, filed Nov. 16, 2017, now pending, the disclosure of which is hereby incorporated entirely herein by reference.

BACKGROUND

1. Technical Field

Aspects of this document relate generally to semiconductor packages that utilize a clip for electrical connection to a device. More specific implementations involve clip-containing semiconductor packages for die.

2. Background

Clips, which are often copper, are used in semiconductor packages to provided electrical connections in semiconductor package. The clips are used as an alternative to wire bonding. Clips can also be used to improve thermal performance of a semiconductor package.

SUMMARY

Implementations of a clip may include a die attach portion including at least one protrusion extending from the die attach portion and a lead frame alignment portion including at least one alignment feature. The at least one alignment feature may be configured to couple into at least one hole in a lead frame thereby aligning the clip with the lead frame. The at least one protrusion may be configured to couple into at least one recess in the die.

Implementations of clips may include one, all, or any of the following:

The die attach portion may include four protrusions extending from the die attach portion.

The lead frame alignment portion may include two alignment features.

A section of the lead frame alignment portion may extend in a first direction substantially perpendicular away from the die attach portion, in a second direction substantially parallel away from the die attach portion, and in a third direction parallel to the first direction.

The alignment feature may not cross a plane formed by the die attach portion.

The clip may include a plurality of bond features configured to ensure a minimum bonding compound thickness.

Implementations of a semiconductor package may include a die coupled to a lead frame and a clip directly coupled to both the die and the lead frame. The lead frame and the clip may form an interlocking alignment mechanism which fixedly couples the clip to the lead frame in a desired physical arrangement. The interlocking alignment mechanism may be configured to prevent movement of the clip during one of reflow and adhesive die attach curing of the die.

Implementations of semiconductor packages may include one, all, or any of the following:

The interlocking alignment mechanism may include an alignment feature on the clip and a hole in the lead frame. The alignment feature may be configured to couple in the hole.

The lead frame and the clip may include a second interlocking alignment mechanism.

The interlocking alignment mechanism may not cross a plane formed by the die.

A section of the clip may extend in a first direction substantially perpendicular away from the die, in a second direction substantially parallel away from the die, and in a third direction parallel to the first direction.

A lead frame alignment portion of the clip extending along a side of the semiconductor package may be longer than one of a length and a width of a die attach portion of the clip.

Implementations of a semiconductor package may include a die including at least one recess in a first side of the die, a lead frame coupled to the first side of the die, the lead frame comprising at least one opening therein, and a clip including a die attach portion including at least one protrusion extending from the die attach portion, and a lead frame alignment portion comprising at least one alignment feature. The at least one alignment feature may be configured to slidably couple into the at least one opening in the lead frame. The at least one protrusion may be configured to couple into the at least one recess in the die.

Implementations of semiconductor packages may include one, all, or any of the following:

The at least one opening may extend completely through the lead frame.

The die attach portion may include four protrusions and the die may include four corresponding recesses.

The lead frame alignment portion may include two alignment feature and the lead frame may include two openings corresponding with the two alignment features.

A cross section of the lead frame alignment portion may extend in a first direction substantially perpendicular away from the die, in a second direction substantially parallel away from the die, and in a third direction parallel to the first direction.

The alignment feature may not cross a plane formed by the die.

A length of the lead frame alignment portion extending along a side of the semiconductor package may be longer than one of a length and a width of the die attach portion.

The alignment feature may be configured to prevent movement of the clip during one of reflow and adhesive die attach curing of the die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is a top view of a clip;

FIG. 2 is a first side view of the clip of FIG. 1;

FIG. 3 is a second side view of the clip of FIG. 1;

FIG. 6 is a cross sectional side view of the clip of FIG. 5 coupling the die to the lead frame.

DESCRIPTION

Figure 5:
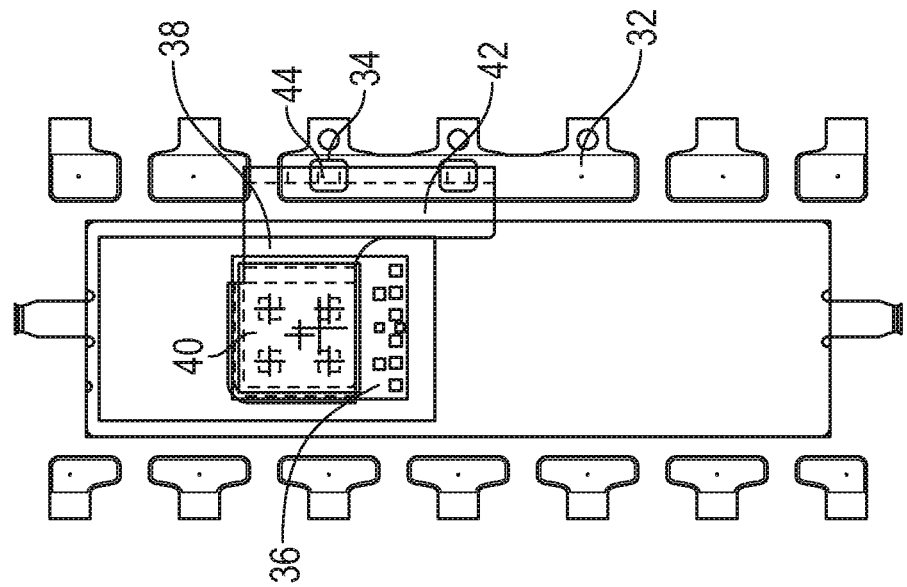
FIG. 5 is a top view of a clip coupling a die to the lead frame of FIG. 4.

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

The semiconductor package disclosed herein includes a clip. In various implementations, the implementations of clips disclosed herein may be copper. In other implementations, the clips disclosed herein may be made, by non-limiting example, from other metals, metal alloys, or other electrically/thermally conductive materials. Referring to FIG. 1, a top view of a clip is illustrated. The clip 2 includes a die attach portion 4. As illustrated, the die attach portion 4 includes at least one protrusion 6 extending from the die attach portion. The protrusion may take various shapes and sizes. An outer perimeter of the protrusion may be, by non-limiting example, substantially square, rectangular, circular, ovate, or any other closed perimeter three dimensional shape. In FIG. 1, protrusion 6 is illustrated extending into the page. In various implementations, as illustrated by FIG. 1, the die attach portion 4 includes four protrusions. When the clip has more than a single protrusion, the protrusions may be similar and symmetrical along axes between the protrusions. In some implementations, however, no protrusions may be used, particularly where the die itself has bonding features thereon, such as, by non-limiting example, bumps, studs, or raised traces.

The clip also includes a lead frame alignment portion 8 coupled to the die attach portion. The lead frame alignment portion 8 includes at least one alignment feature 10. In the implementation illustrated by FIG. 1, the lead frame alignment portion 8 includes two alignment features which are illustrated extending into the page (see FIG. 3). The one or more alignment features 10 may be located on an edge of the lead frame alignment portion 8.

The lead frame alignment portion 8 may include a length 12 which is configured to extend along a side of the semiconductor package. The length 12 may be longer than either a length 16 of the die attach portion or a width 14 of the die attach portion. In other implementations, the length 12 may be substantially the same as or shorter than a length 16 of the die attach portion or a width 14 of the die attach portion. The width 14 of the die attach portion may be substantially the same as the length 16 of the die attach portion, while in other implementations the width and the length may vary depending on the die/package dimensions. In various implementations the width 18 of the lead frame alignment portion 8 may be smaller than a width 14 of the die attach portion, while in other implementations the width 18 may be substantially the same as or greater than the width 14.

As illustrated in FIG. 1, when viewed from above the clip may form an L-shape or a backwards L-shape as the die attach portion 4 intersects the lead frame alignment portion 8 at a right angle at an end of the lead frame alignment portion 8. In other implementations, the die attach portion 4 may intersect the lead frame alignment portion 8 in a middle portion of the lead frame alignment portion to form a T-shaped clip.

Referring to FIG. 2, a first side view of the clip of FIG. 1 is illustrated. FIG. 2 is a view of the side 20 of FIG. 1. As seen in FIG. 2, the at least one protrusion 6 extends away from the die attach portion 4. The one or more protrusions 6 may be configured to fit in and couple into one or more corresponding recesses in a die, such as, by non-limiting example, a pad opening, a via, or another type of recessed electrical contact. In various implementations, the clip 2, when viewed from the side as illustrated in FIG. 2, may form a hook shape. Specifically, a first portion 22 of the lead frame alignment portion 8 may extend away from the die attach portion 4 in a first direction substantially perpendicular to the die attach portion. A second portion 24 may extend away from the die attach portion 4 in a second direction substantially parallel to the die attach portion. A third portion 26 may extend away from the second portion 24 in a direction that is substantially parallel to the first direction. The end of the third portion 26 may include the one or more alignment features 10. In various implementations, the one or more alignment features 10 do not cross a plane formed by the die attach portion 4, while in other implementations, the at least one alignment feature 10 extends through or below a plane formed by the die attach portion 4.

Referring to FIG. 3, a second side view of the clip of FIG. 1 is illustrated. FIG. 3 is a view of the side 28 of FIG. 1. As seen in FIG. 3, the clip may include at least one (or two, as is illustrated) alignment features 10. Each alignment feature extends below the remainder of the third portion 26 of the lead frame alignment portion 8. The ends 30 of the alignment features 10 may be, by non-limiting example, pointed, rounded, conical, pin-shaped, or rectangular. In various implementations, the alignment features 10 may be self-aligning with the lead frame due to the shape of the alignment portions 10. The at least one alignment feature is configured to couple into at least one corresponding hole in the lead frame and align the clip with the lead frame.

In various implementations, the clip may include a plurality of bond features 64. The bond features 64 may extend from the clip in the same direction as the alignment features 10, however, the bond features 64 do not extend as far from the clip as the alignment features 10. The bond features 64 may be configured to ensure a minimum bonding compound thickness between the clip and a lead frame as they provide space between the clip and the lead frame when the clip is coupled to the lead frame. In various implementations, the bonding compound used may be solder paste, while in other implementations other bonding compounds, such as epoxy, may be used.

Figure 4:
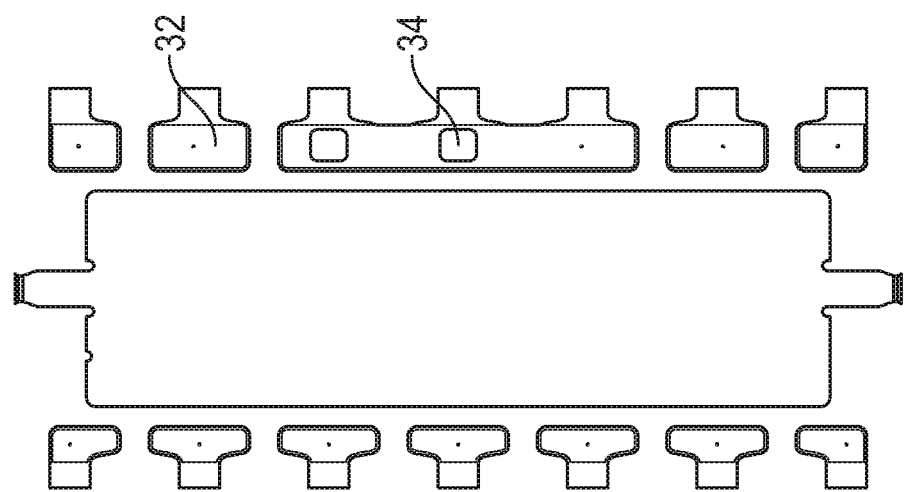
FIG. 4 is a top view of a lead frame.

In addition to a clip, the semiconductor package includes a lead frame. Referring to FIG. 4, a top view of a lead frame 32 is illustrated. The lead frame 32 includes at least one hole or opening 34. In various implementations, the lead frame 32 includes as many openings 34 as there are alignment features 10 of the clip. In the particular implementation illustrated in FIG. 5, the lead frame 32 includes two openings 34 therethrough. The openings 34 may extend entirely through the lead frame 32 or only partially through the lead frame, forming a well therein. Furthermore, in some implementations, the openings 34 may be located on an edge of the lead frame 32. In various implementations where the openings 34 form wells in the lead frame, the openings 34 may include a bottom which is, by non-limiting example, conical, rounded, or pointed. Further, in various implementations with openings forming wells in or holes through the lead frame, the sidewalls of the openings may be sloped or angled. Such sidewalls of openings and bottoms of wells may match the shape of the alignment features of a clip and/or may facilitate the self-alignment properties of the clip.

The semiconductor package also includes a die that is coupled to the lead frame and the clip. Referring to FIG. 5, a top see through view of a clip coupling a die 36 to the lead frame 32 of FIG. 4 is illustrated. The package includes a clip 38 which is directly coupled to both the lead frame 32 and the die 36. The clip 38 may be any clip previously disclosed herein. The clip 38 extends over the top of and covers a portion of both the die 36 and the lead frame 32. As illustrated in FIG. 1, the clip 38 is illustrated as see through in order to better illustrate the relationship of the clip 38 to the die 36 and the lead frame 32. As illustrated, the clip 38 includes a die attach portion 40. In various implementations, and as illustrated in FIG. 5, the die attach portion 40 may cover a significant portion of the die 36, while in other implementations it may cover a majority or a minority of the upper surface of the die 36. In FIG. 5 the die attach portion 40 covers a majority of the upper surface of the die 36. The clip 38 also includes a lead frame alignment portion 42. As illustrated, the lead frame alignment portion 42 may at least partially cover a portion of the lead frame 32 which includes the openings 34 configured to receive the alignment portions 44.

Referring to FIG. 6, a cross sectional side view of the clip of FIG. 5 coupling the die to the lead frame is illustrated. FIG. 6 illustrates how the clip 38 is directly coupled to the die 36 and to/into the openings in the lead frame 32. The die 36 may include one or more recesses 46 on a first side 48 of the die which contact the clip 38. In a particular implementation, the die 36 includes four recesses. As previously disclosed herein, the clip 38 includes a die attach portion 40 which includes at least one protrusion 50 that is configured to couple into the one or more recesses 46. The number of recesses and the number of protrusions may be the same, with each protrusion configured to couple into a corresponding recess. In other implementations, the die attach portion 40 may include protrusions that are not received into recesses within the die, but that contact a flat surface of the die 36. In still other implementations, the die attach portion 40 may not include protrusions and the die 36 may not include recesses, rather a flat surface of the die attach portion and a flat surface of the die may be design to directly and fully contact each other.

As previously described herein, the clip 38 includes a lead frame alignment portion 42. The lead frame alignment portion 42 may include a first portion 52 which may extend away from the die in a first direction substantially perpendicular to the die 36. The lead frame alignment portion 42 may include a second portion 54 which may extend away from the die 36 in a second direction substantially parallel to the die attach portion. The lead frame alignment portion 42 may include a third portion 56 which may extend away from the second portion 54 in a direction that is substantially parallel to the first portion 52. The end of the third portion 56 may include the one or more alignment features 44. The alignment features 44 may be configured to slidably couple into an opening or hole 34 of the lead frame 32. In implementations where the hole 34 in the lead frame extends completely through the lead frame, the alignment feature 44 may extend completely through the hole 34. In implementations where the opening is a slot or reentrant opening in the leadframe, the alignment feature 44 may rest fully in the slot or reentrant opening. The alignment feature 44 together with the hole 34 in the lead frame form an interlocking alignment mechanism 62 which fixedly couples the clip to the lead frame in a desired physical arrangement. In various implementations the semiconductor package may include a single interlocking alignment mechanism, while in other implementations the semiconductor package may include two or more interlocking alignment mechanisms formed by a single clip. In various implementations the alignment feature 44 is secured or locked within the hole 34 using a clasp or other fastening mechanism. In other implementations, gravity force is used to secure the alignment feature 44 within the hole 34. The interlocking alignment mechanism 62 is configured to prevent movement of the clip 38 in relation to the die 36 and the lead frame 32 during either reflow of the die, adhesive die attach curing of the die, or any other process or force that could alter the alignment of the clip from the die or lead frame. In this manner, the interlocking alignment mechanism can ensure proper alignment of the clip and the die in semiconductor package which may result in assuring the proper function and performance of the semiconductor package.

In various implementations, the interlocking alignment mechanism 62, or the alignment feature 44, do not cross a plane formed by the die 36 as the interlocking alignment mechanism and alignment feature are above the plane formed by the die. In other implementations, the interlocking alignment mechanism 62 and/or alignment feature 44 may cross a plane formed by the die 36 or may extend below the plane formed by the die 36.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A clip comprising:
   a die attach portion comprising at least one protrusion extending from the die attach portion; and
   a lead frame alignment portion comprising at least one alignment feature;
   wherein the at least one protrusion is configured to couple into at least one recess in the die.

2. The clip of claim 1, wherein the die attach portion comprises four protrusions extending from the die attach portion.

3. The clip of claim 1, wherein the lead frame alignment portion comprises two alignment features.

4. The clip of claim 1, wherein a section of the lead frame alignment portion extends in a first direction substantially perpendicular away from the die attach portion, in a second direction substantially parallel away from the die attach portion, and in a third direction parallel to the first direction.

5. The clip of claim 1, wherein the at least one alignment feature does not cross a plane formed by the die attach portion.

6. The clip of claim 1, further comprising a plurality of bond features configured to ensure a minimum bonding compound thickness.

7. A clip comprising:
a die attach portion configured to directly couple within a recess comprised in a die; and
a lead frame alignment portion configured to directly couple to a lead frame;
wherein the lead frame alignment portion is configured to fixedly couple the clip to the lead frame in a desired physical arrangement; and
wherein the die attach portion is configured to fixedly couple the clip to the die in a desired physical arrangement.

8. The clip of claim 7, wherein the lead frame alignment portion is configured to couple in a hole of the lead frame.

9. The clip of claim 7, wherein the lead frame alignment portion is configured to prevent movement of the clip during one of reflow or adhesive die attach curing of the die.

10. The clip of claim 7, wherein the lead frame alignment portion does not cross a plane formed by the die.

11. The clip of claim 7, wherein a section of the clip extends in a first direction substantially perpendicular away from the die, in a second direction substantially parallel away from the die, and in a third direction parallel to the first direction.

12. The clip of claim 7, wherein the lead frame alignment portion of the clip extending along a side of a semiconductor package is longer than one of a length and a width of the die attach portion of the clip.

13. A semiconductor package comprising:
a die comprising at least one recess in a first side of the die;
a lead frame coupled to the first side of the die; and
a clip comprising;
a die attach portion comprising at least one protrusion extending from the die attach portion; and
a lead frame alignment portion comprising at least one alignment feature and configured to couple to the lead frame;
wherein the at least one protrusion is configured to couple into the at least one recess in the die.

14. The semiconductor package of claim 13, wherein the lead frame comprises at least one opening extending completely through the lead frame.

15. The semiconductor package of claim 13, wherein the die attach portion comprises four protrusions and the die comprises four corresponding recesses.

16. The semiconductor package of claim 13, wherein the lead frame alignment portion comprises two alignment features and the lead frame comprises two openings corresponding with the two alignment features.

17. The semiconductor package of claim 13, wherein a cross section of the lead frame alignment portion extends in a first direction substantially perpendicular away from the die, in a second direction substantially parallel away from the die, and in a third direction parallel to the first direction.

18. The semiconductor package of claim 13, wherein the lead frame alignment portion does not cross a plane formed by the die.

19. The semiconductor package of claim 13, wherein a length of the lead frame alignment portion extending along a side of the semiconductor package is longer than one of a length and a width of the die attach portion.

20. The semiconductor package of claim 13, wherein the lead frame alignment portion is configured to prevent movement of the clip during one of reflow or adhesive die attach curing of the die.

* * * * *